United States Patent [19]
Nakagawa et al.

[11] Patent Number: 5,330,574
[45] Date of Patent: Jul. 19, 1994

[54] ELECTRODE FORMING APPARATUS

[75] Inventors: Tadahiro Nakagawa; Shizuma Tazuke; Mitsuro Hamuro; Hirokazu Higuchi; Katsuyuki Moriyasu; Akihiko Takahashi, all of Kyoto, Japan

[73] Assignee: Murata Manufacturing Co., Ltd., Japan

[21] Appl. No.: 861,129

[22] Filed: Mar. 31, 1992

[30] Foreign Application Priority Data

Nov. 8, 1991 [JP] Japan ............... 3-321332
Dec. 3, 1991 [JP] Japan ............... 3-347938
Feb. 28, 1992 [JP] Japan ............... 4-078980

[51] Int. Cl.$^5$ .................. B05C 3/18; B05C 11/04
[52] U.S. Cl. .................. 118/120; 118/123; 118/413; 118/429; 118/425
[58] Field of Search ............... 118/120, 123, 200, 225, 118/256, 400, 413, 429, 425

[56] References Cited

U.S. PATENT DOCUMENTS

| | | | |
|---|---|---|---|
| 4,392,450 | 7/1983 | Prevo | 118/120 |
| 4,450,226 | 5/1984 | Bloothoofd | 118/120 |
| 4,509,455 | 4/1985 | Shirataki | 118/413 |
| 4,698,192 | 10/1987 | Kuze et al. | 264/101 |
| 4,909,841 | 3/1990 | Iyer et al. | 75/233 |
| 5,044,306 | 9/1991 | Erdmann | 118/120 |

FOREIGN PATENT DOCUMENTS 3435507 4/1986 Fed. Rep. of Germany ...... 118/200
3-44404 2/1991 Japan .

Primary Examiner—W. Gary Jones
Assistant Examiner—Todd J. Burns
Attorney, Agent, or Firm—Ostrolenk, Faber, Gerb & Soffen

[57] ABSTRACT

An electrode forming apparatus comprises a recovery blade for collecting electrode paste on the bottom surface of a dipping vessel toward a first end of the dipping vessel and a levelling blade for levelling the electrode paste, being collected toward the first end, toward a second end of the dipping vessel for adjusting the same to a constant film thickness. The recovery blade and the levelling blade are supported by a blade support frame, which is horizontally reciprocated with respect to the dipping vessel. The recovery blade is vertically moved by a cylinder, while the vertical position of the levelling blade is finely controlled by a levelling control motor. Thus, the film thickness of the electrode paste can be accurately adjusted with excellent repeatability, thereby carrying out homogeneous electrode application.

14 Claims, 7 Drawing Sheets

ELECTRODE FORMING APPARATUS

BACKGROUND OF THE INVENTION

1. Field of the Invention

The present invention relates to an electrode forming apparatus for applying electrode paste onto ends of chip type electronic components. More particularly, the invention relates to an apparatus for forming electrodes of uniform width and thickness by spreading the electrode paste uniformly over the bottom of a dipping vessel used to apply the paste to the chip type electronic components.

2. Description of the Background Art

In general a holding plate having a number of receiving holes is employed for efficiently applying electrodes to end portions of a number of chip type electronic components, as disclosed in U.S. Pat. No. 4,395,184. This holding plate comprises a hard substrate, a thin flat plate portion which is formed at a central portion of the substrate, provided with a number of through holes, and a rubber-like elastic member which is embedded in a concave portion defined in the flat plate portion. The rubber-like elastic member is provided with receiving holes, passing through the elastic member, which are smaller in diameter than the through holes provided in the thin plate portion. The holding plate elastically holds chip type electronic components in the receiving holes so that the components partially project from the holding plate, and electrode paste of silver or the like is uniformly applied to the projected portions. Thereafter, the chip type electronic components are heated to dry the electrode paste.

The aforementioned U.S. Patent describes an exemplary method of applying electrode paste to such chip type electronic components with a roller. In this method, a holding plate holding chip type electronic components which partially project from its upper surface is carried by a conveyor. A roller which is coated with electrode paste on its peripheral surface is brought into contact with the projecting portions of the chip type electronic components to apply the electrode paste onto the chip type electronic components. In order to obtain uniform thickness of the paste around the peripheral surface of the roller, a scraper is employed for scraping off the excess part of the paste while rotating the roller.

When the chip type electronic components are about 1.6 to 5.7 mm in length, for example, the electrodes have extremely small thickness, ranging from about 0.15 to 0.3 mm, which must be controlled with high accuracy. In the aforementioned method, however, the paste which is applied to the peripheral surface of the roller flows, following the rotation of the peripheral surface, and hence the thickness of the paste varies to cause variation in thickness of the electrodes which are formed on the chip type electronic components. Such variation may also be caused by vibration of the conveyor or fluctuation in the degree of horizontalness of the apparatus.

Japanese Patent Publication No. 3-44404 (1991) describes a method of coating the upper surface of a flat coating plate with a thin film of electrode paste. A holding plate, holding chip type electronic components so that they partially project downwards, approaches the coating plate, thereby pressing the projected portions of the chip type electronic components against the coating plate to apply the electrode paste to the chip type electronic components. This method avoids the problems encountered in the aforementioned method employing a roller. According to this method, the projecting portions of the chip type electronic components are pressed against the bottom surface of the coating plate which is coated with the paste. This method prevents variation in length of projecting portions and provides uniform electrode thickness.

When a single application step is completed, however, the paste film is reduced in thickness in portions applied to the chip type electronic components. Therefore, it is necessary to temporarily collect the paste remaining on the coating plate to re-adjust the same to a constant thickness. Thus, much time is required for adjusting the film thickness and it is difficult to adjust the paste film to a constant thickness with high repeatability.

SUMMARY OF THE INVENTION

Accordingly, an object of the present invention is to provide an electrode forming apparatus, which can accurately adjust the film thickness of electrode paste with excellent repeatability, thereby carrying out homogeneous electrode application.

In order to attain the aforementioned object, the present invention provides an electrode forming apparatus for pressing chip type electronic components, being held in receiving holes of a holding plate in partially downwardly projected states, against electrode paste which is coated onto the bottom surface of a dipping vessel for applying electrodes onto ends of the chip type electronic components. The apparatus comprises a recovery blade for collecting the electrode paste on the bottom surface of the dipping vessel toward a first end of the dipping vessel, a levelling blade for levelling the electrode paste, being collected toward the first end of the dipping vessel, toward a second end of the dipping vessel for adjusting the same to a constant thickness, driving means for relatively horizontally reciprocating the recovery blade and the levelling blade with respect to the dipping vessel, first vertical moving means for vertically moving the recovery blade between a position in contact with the bottom surface of the dipping vessel and an upwardly retracted position, and a second vertical moving means for vertically moving the levelling blade between a position close to the bottom surface of the dipping vessel and an upwardly retracted position.

The recovery blade and the levelling blade may be relatively horizontally reciprocated with respect to the dipping vessel. Thus, the dipping vessel may be set in a constant position so that the blades are reciprocated, or the blades may be set in constant positions so that the dipping vessel is reciprocated.

First, the recovery and levelling blades are moved toward a first end of the dipping vessel, and a prescribed amount of electrode paste is injected into the dipping vessel. Then, the recovery blade is downwardly moved by the first vertical moving means to the position in contact with the bottom surface of the dipping vessel, and is horizontally moved by the driving means from the first end to a second end of the dipping vessel. The levelling blade, which is currently located in the upwardly retracted position, is horizontally moved integrally with the recovery blade. Since the recovery blade is moved toward the second end of the dipping vessel, the electrode paste injected into the dipping vessel is substantially entirely collected toward the second end. Then, the recovery blade is upwardly moved by the first vertical moving means, while the levelling blade is downwardly moved by the second vertical moving means to the position close to the bottom surface of the dipping vessel. A clearance formed between the levelling blade and the bottom surface of the dipping vessel defines the film thickness of the electrode paste. In this state, the levelling blade is reversely horizontally moved from the second end toward the first end of the dipping vessel, thereby forming a paste film of a constant thickness on the bottom surface of the dipping vessel.

The first vertical moving means, which is simply adapted to bring the recovery blade into contact with the bottom surface of the dipping vessel, requires no high accuracy and may be formed by a direct actuator such as a cylinder. On the other hand, the second vertical moving means is preferably prepared from an accurate fine-controllable driving mechanism such as a mechanism including a stepping motor and a ball screw, since it is necessary to strictly set the clearance between the levelling blade and the dipping vessel.

According to the present invention, the recovery blade is first brought into contact with the bottom surface of the dipping vessel to collect the electrode paste toward the first end of the dipping vessel and then the levelling blade is approached to the bottom surface of the dipping vessel to level the electrode paste in a constant film thickness, whereby the electrode paste can be automatically collected and levelled. Thus, the electrode paste can be extremely easily adjusted to a constant film thickness with excellent repeatability. Consequently, it is possible to homogeneously apply electrodes onto ends of chip type electronic components.

The foregoing and other objects, features, aspects and advantages of the present invention will become more apparent from the following detailed description of the present invention when taken in conjunction with the accompanying drawings.

DETAILED DESCRIPTION OF THE INVENTION

Figure 1:
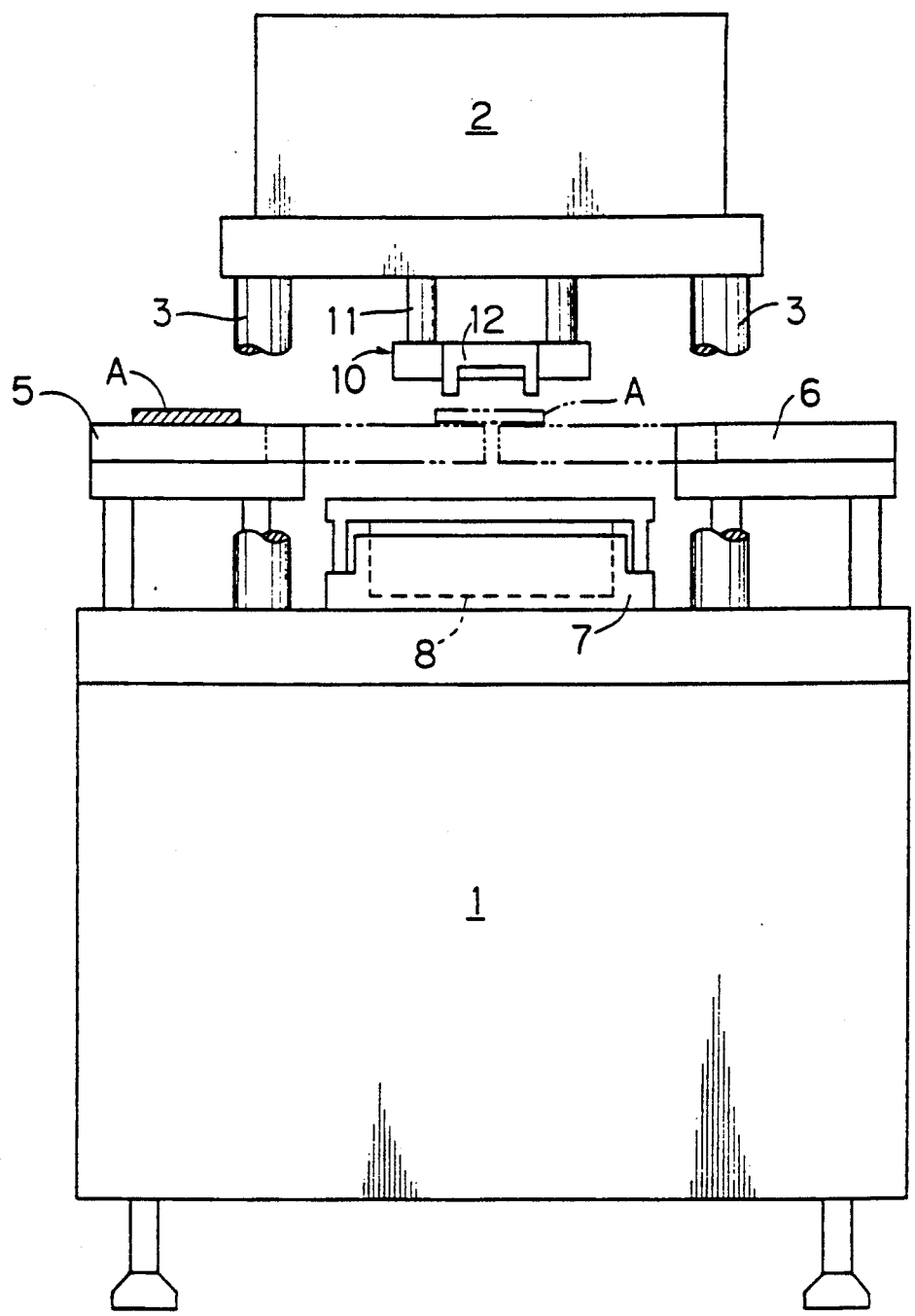
FIG. 1 is a front elevational view schematically showing an electrode forming apparatus according to an embodiment of the present invention.
Figure 2:
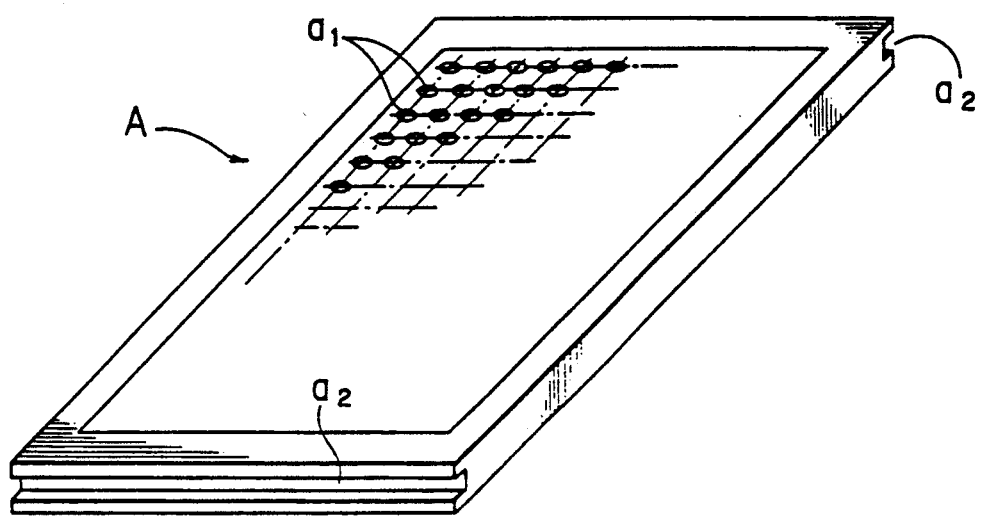
FIG. 2 is a perspective view of a holding plate which is employed in the present invention.
Figure 3:
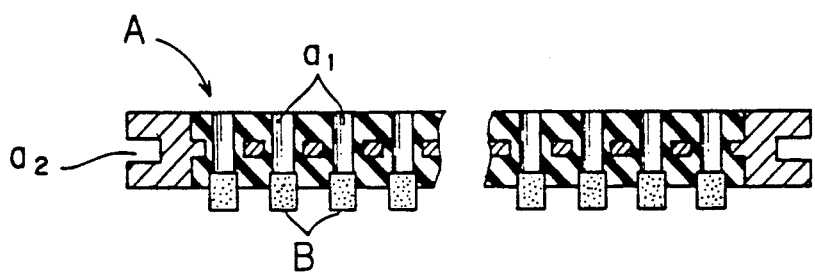
FIG. 3 is a sectional view showing the holding plate holding chip type electronic components.

FIG. 1 shows an electrode forming apparatus according to an embodiment of the present invention, which is adapted to apply electrodes onto end portions of chip type electronic components B. As shown in FIGS. 2 and 3, the chip type electronic components B are elastically held by a holding plate A so as to partially project from receiving holes $a_1$. The structure of this holding plate A is similar to that disclosed in Japanese Patent Publication No. 3-44404 (1991).

The inventive electrode forming apparatus is formed by a body 1, a dip head portion 2, a supply conveyor 5, a discharge conveyor 6, a dipping vessel 7, and a blade portion 8. The body 1 contains a control unit (not shown) for controlling the operation of these elements.

The dip head portion 2 is fixed onto the body 1 by fixed poles 3. A chucking portion 10, which is vertically movable, is suspended horizontally from the lower part of the dip head portion 2 through a plurality of shafts 11. The dip head portion 2 contains vertical moving means (not shown), driven to vertically move the shafts 11, thereby vertically moving the chucking portion 10. The chucking portion 10 is provided on opposite horizontal sides with a pair of chucking pawls 12, which are horizontally opened and closed to engage grooves $a_2$ provided on both sides of the holding plate A, the holding plate A being supplied by the conveyor 5.

Each of the supply and discharge conveyors 5 and 6 is formed by a pair of halves, one above the other. Each lower half is provided with a sliding mechanism for sliding the upper half toward the center of the electrode forming apparatus; the upper half is provided with a carriage mechanism for unidirectionally carrying the holding plate A. The upper halves of these conveyors 5 and 6 can be moved from opposite directions toward central positions, as shown by two-dot chain lines in FIG. 1.

The conveyors 5 and 6 and the chucking portion 10 operate as follows:

The holding plate A is placed on the supply conveyor 5. This holding plate A holds the chip type electronic components B so that they project downward, shown in FIG. 3. The upper half of the supply conveyor 5 is slid toward the central position, carrying the holding plate A, the carriage mechanism contained therein is driven when the upper halves of the conveyors 5 and 6 are closest to each other so that the holding plate A extends across and is supported by the two upper halves of the conveyors 5 and 6. The chucking portion 10 is moved down to engage the holding plate A with the chucking pawls 12. Thereafter, the upper halves of the conveyors 5 and 6 are retracted to the positions shown by solid lines in FIG. 1. The chucking portion 10 is further moved down to press the chip type electronic components, being held by the holding plate A, against the bottom surface of the dipping vessel 7, thereby applying electrode paste on the components. Thereafter, the chucking portion 10 is moved up to a position higher than the carriage level of the conveyors 5 and 6, which in turn are again moved to the positions shown by the two-dot chain lines in FIG. 1, so that the holding plate A is again supported across the conveyors 5 and 6. The carriage mechanisms contained in the conveyors 5 and 6 are then driven to transfer the holding plate A onto the discharge conveyor 6, for carrying the same to a subsequent step.

The structures of the apparatus for moving the chucking portion 10 and the conveyors 5 and 6 are similar to those shown in Japanese Patent Application NO. 3-347938 (1991).

Figure 4:
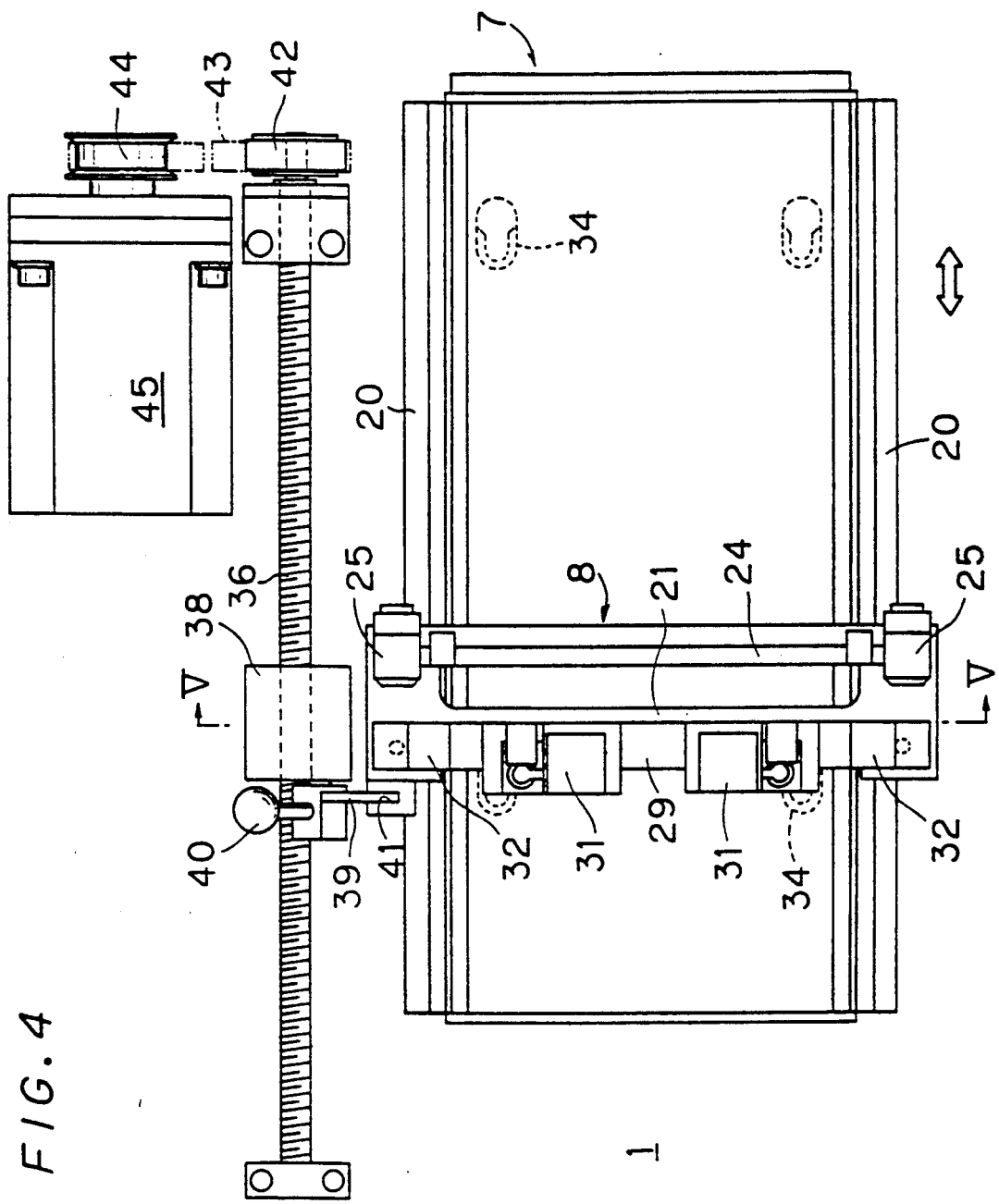
FIG. 4 is a plan view illustrating a dipping vessel and a blade portion.
Figure 5:
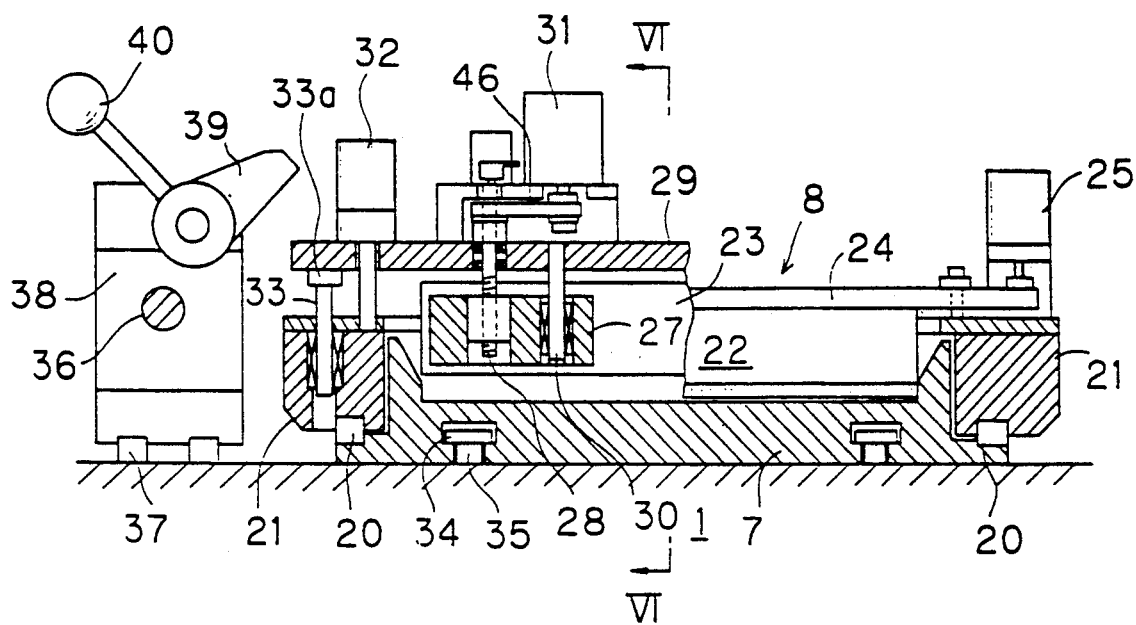
FIG. 5 is a sectional view taken along the line V—V in FIG. 4.
Figure 6:
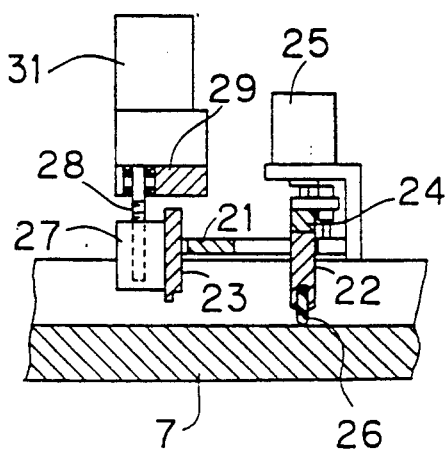
FIG. 6 is a sectional view taken along the line VI—VI in FIG. 5.

FIG. 4 and 6 illustrate the structures of the dipping vessel 7 and the blade portion 8.

The dipping vessel 7 is in the form of a rectangular plate, which is slightly larger than the holding plate A, and is provided with a pair of guide rails 20 on both sides of the longer edges thereof. A blade supporting frame 21 is slidably supported on the guide rails 20 so as to horizontally extend across the dipping vessel 7. A recovery blade 22, for collecting electrode paste at an end portion of the dipping vessel 7, and a levelling blade 23, for adjusting the electrode paste to a prescribed thickness, are mounted on the blade supporting frame 21 so as to independently execute vertical movements. The blades 22 and 23 have the same widths, which are slightly smaller than the inner width of the dipping vessel 7 along its shorter edges.

The recover blade 22 is fixed to the lower surface of a bridge bar 24, which is vertically movable, supported on the upper portion of the blade supporting frame 21. This bridge bar 24 is vertically driven by a pair of cylinders 25, which are provided on both end portions of the blade supporting frame 21. A rubber blade member 26 is mounted on the lower end of the recovery blade 22, to be brought into close contact with the bottom surface of the dipping vessel 7 thereby collecting the electrode paste.

A pair of blocks 27 are fixed to one side surface of the levelling blade 23, so as to fit with screw shafts 28 and to slidably receive sliding shafts 30, whose upper end portions are fixed to a support plate 29. The screw shafts 28 rotatably pass through the support plate 29, and their upper end portions are driven by levelling control motors 31 through belts 46. Vertical cylinders 32 are fixed to horizontal end portions of the support plate 29, so that piston rods thereof are coupled to the blade supporting frame 21. Sliding shafts 33 downwardly project from both end portions of the support plate 29, and are received in the blade supporting frame 21 so as to be vertically movable. Thus, it is possible to substantially move the horizontally held support plate 29 in a vertical manner with respect to the blade supporting frame 21 by driving the vertical cylinders 32, while it is possible to finely control the vertical position of the levelling blade 23 with respect to the support plate 29 by driving the levelling control motors 31. The lower limit position of the support plate 29 is set by boss portions 33a of the sliding shafts 33. Consequently, it is possible to precisely set the height of the levelling blade 23 from the bottom surface of the dipping vessel 7. In other words, it is possible to precisely control the thickness of the electrode paste which is applied to the bottom surface of the dipping vessel 7.

Four mounting holes 34, each of which has a circular end and another end having a T-shaped longitudinal section, are formed in the lower surface of the dipping vessel 7, while four pins with heads 35, corresponding to the mounting holes 34, upwardly protrude from the body 1. The dipping vessel 7 is placed on the body 1 so that the circular portions of the mounting holes 34 receive the heads of the pins 35, and is slid towards the right as shown in FIG. 4. Thus, the heads of the pins 35 engage the T-shaped portions of the mounting holes 34, thereby positioning the dipping vessel 7 with respect to the body 1. The pins 35 are downwardly moved by a cylinder or the like, so that the dipping vessel 7 is held by the body 1 in close contact.

A ball screw 36 is arranged outside the dipping vessel 7, parallel with a longer edge thereof, so as to fit with a nut member 38, which is slidable along guide rails 37 provided on the body 1. An engaging member 39 having a handle 40 is provided on the nut member 38, so as to be swingable about a shaft which is parallel to the ball screw 36. The engaging member 39 is driven by the handle 40 to swing towards the blade supporting frame 21, and engage a receiving groove 41 which is formed in a rear end portion of the blade supporting frame 21, thereby coupling the nut member 38 with the blade supporting frame 21. A pulley 42 is mounted on the right end of the ball screw 36. When the pulley 42 is driven by a motor 45 through a belt 43 and a pulley 44, the nut member 38 and the blade supporting frame 21 move together horizontally.

The operation of the blades portion 8 is now described with reference to FIGS. 7(a) to 7(c).

Figure 7A:
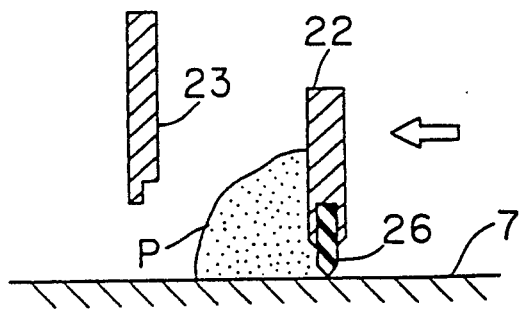
FIGS. 7(a) to 7(c) are explanatory diagrams for illustrating a method of applying paste.
Figure 7B:
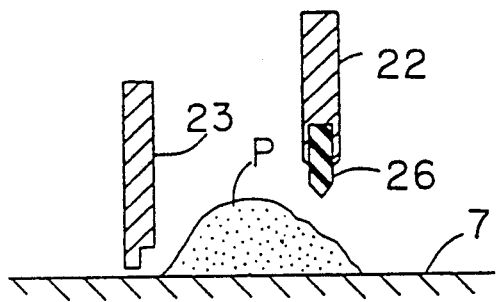
Figure 7C:
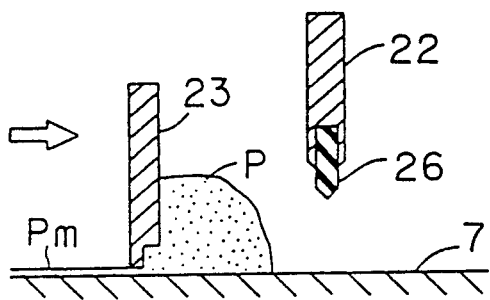

The blade member 26 of the recovery blade 22 is pressed against the bottom surface of the dipping vessel 7 and the blade supporting frame 21 is driven to the left as shown in FIG. 7(a), thereby collecting on the left the electrode paste P which is contained in the dipping vessel 7. The recovery blade 22 is then moved up and the levelling blade 23 approaches the bottom surface of the dipping vessel 7, as shown in FIG. 7(b). At this time, a pile of the paste collected by the recovery blade 22 is formed in a position in front of the levelling blade 23. Then, the levelling blade 23 is driven to the right as shown in FIG. 7(c), whereby a thin film Pm of the electrode paste is formed on the bottom surface of the dipping vessel 7 corresponding to the clearance between the levelling blade 23 and the dipping vessel 7.

Figure 8:
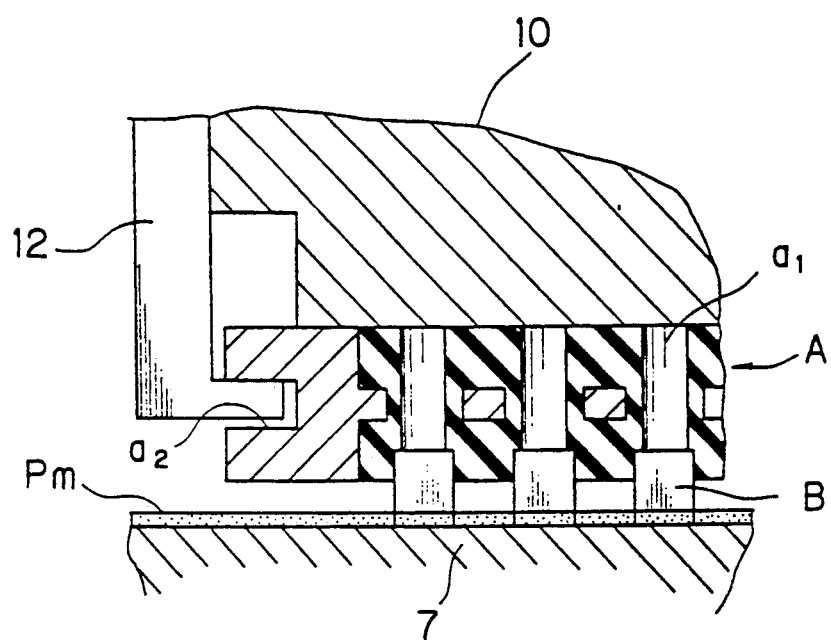
FIG. 8 is an explanatory diagram showing a method of applying electrode paste onto chip type electronic components.

A method of applying electrodes to the projected portions of the chip type electronic components B, held by the holding plate A, using the dipping vessel 7, which is coated with the thin film Pm of electrode paste, is now described with reference to FIG. 8.

The forward ends of the chucking pawls 12 are inserted in the chucking grooves $a_1$ of the holding plate A, holding the chip type electronic components B so that they project downward, and the chucking pawls 12 are moved up to bring the upper surface of the holding plate A into pressure contact with the chucking portion 10. The chucking portion 10 has previously been set to be strictly parallel with the bottom surface of the dipping vessel 7. The vertical moving means contained in the dip head portion 2 is driven to downwardly move the chucking portion 10 in a horizontal state. When the projecting portions of the chip type electronic components B come into contact with the bottom surface of the dipping vessel 7, the chucking portion 10 is further slightly moved down so as to press the chip type electronic components B slightly upward into the receiving holes $a_1$. Thus, the projecting portions of the chip type electronic components B are adjusted to have constant lengths, so as to be provided with the electrodes of uniform width along the sides of the chip type electronic components B as shown in FIG. 8. Therefore, by pressing the projecting portion of the chip type electronic components B into the film Pm of electrode paste, coated on the bottom surface of the dipping vessel 7, the coating of electrode paste covers the tips of the chip type electronic components B, and also extends along and around the sides of the electronic components B to provide electrodes of uniform width. At this time, the chucking pawls 12 are not in contact with the bottom surface of the dipping vessel 7 since the forward ends thereof are received in the chucking grooves a₂ of the holding plate A, and the dipping operation can be carried out with no hindrance.

Since a single holding plate A generally holds thousands of chip type electronic components B, a strong reactive force acts on the holding plate A when the chip type electronic components B are pressed against the bottom surface of the dipping vessel 7, which is coated with the paste. However, deformation of the holding plate A is prevented and no variation is caused in electrode width, since the upper surface of the holding plate A is supported over its entire surface by the chucking portion 10. The chip type electronic components B may be pressed against the dipping vessel 7 a plurality of times, in order to improve the accuracy of the electrode widths.

When the engaging member 39 is disengaged from the receiving groove 41, and the mounting holes 34 formed in the bottom surface of the dipping vessel 7 are separated from the pins 35 provided on the body 1, the dipping vessel 7 can be simple replaced by another vessel. In other words, it is possible to replace the paste with another type of paste without removing the paste adhering to the dipping vessel 7 and the blades 22 and 23, whereby the exchange time can be greatly reduced. Since the dipping vessel 7 and the blades 22 and 23 are handled together for changing the paste, no deviation is caused in their positional relation, set to ensure high accuracy in the clearance between the bottom surface of the dipping vessel 7 and the levelling blade 23.

Although the levelling blade 23 is vertically moved by the vertical cylinder 32 and finely controlled by the levelling motor 31 in the aforementioned embodiment, the present invention is not restricted to this structure, but the levelling blade 23 may alternatively be driven by, for example, a stepping motor having high positional accuracy, to omit the fine control motor 31.

Figure 9:
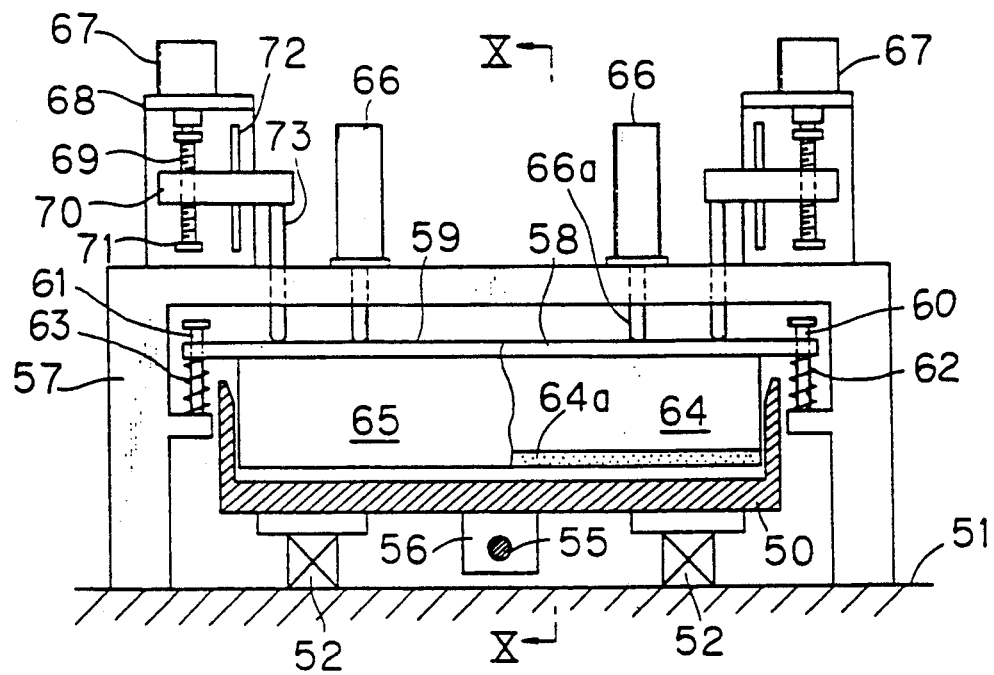
FIG. 9 is a sectional view showing an electrode forming apparatus according to another embodiment of the present invention.
Figure 10:
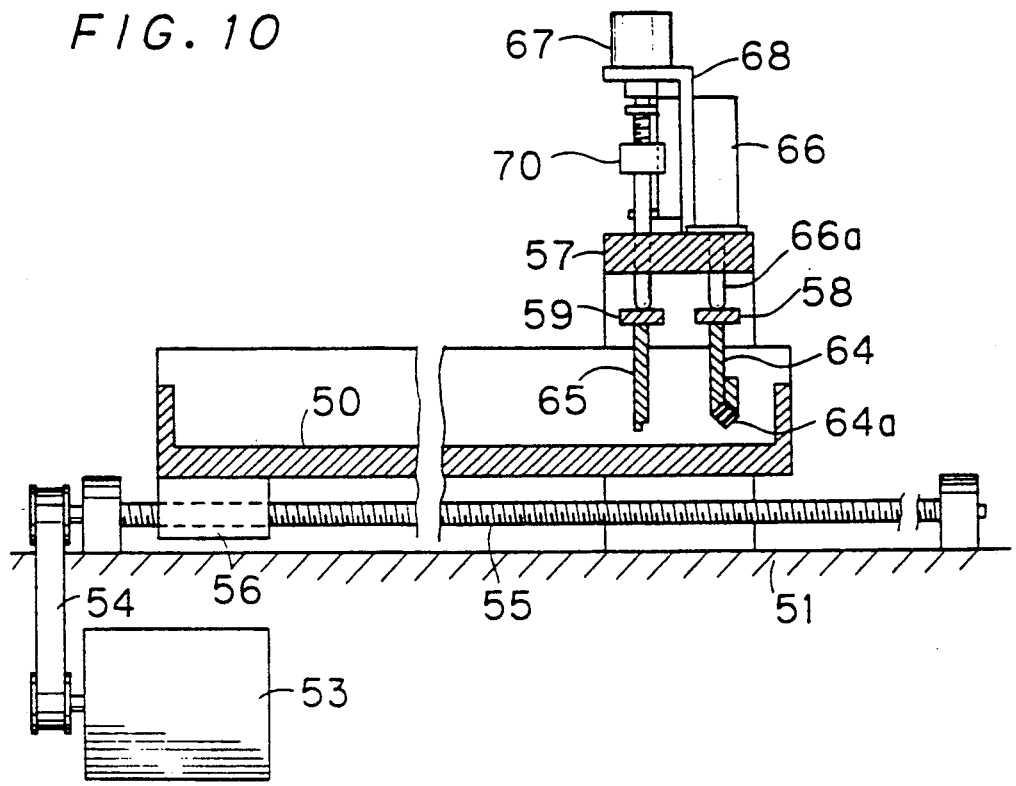
FIG. 10 is a sectional view taken along the line X—X in FIG. 9.

FIGS. 9 and 10 illustrate another embodiment of the present invention, particularly in relation to the dipping vessel.

According to this embodiment, a recovery blade 64 and a levelling blade 65 are set in constant positions while a dipping vessel 50 is moved for levelling the electrode paste.

The dipping vessel 50 is supported by a pair of sliding rails 52, which are set on the table 51, to be slidable perpendicular to the plane of FIG. 9. A ball screw 55 is horizontally arranged on a lower side of the dipping vessel 50 to be driven by a motor 53 via a belt 54, and a nut 56 is fixed to the lower surface of the dipping vessel 50 so as to fit with the ball screw 55. Thus, the ball screw 55 is rotated to horizontally slide the dipping vessel 50.

A planar type blade support frame 57 is provided on the table 51 to extend across the dipping vessel 50, while a pair of blade mounting bars 58 and 59 are mounted on the inner side of the blade support frame 57 by a pair of guide pins 60 and 61 respectively, so as to be vertically movable in a horizontal position. The guide pins 60 and 61 pass through springs 62 and 63, which constantly upwardly urge the blade mounting bars 58 and 59. The recovery blade 64 and the levelling blade 65 are fixed to the lower surfaces of the blade mounting bars 58 and 59 respectively.

A pair of recovery blade lowering cylinders 66 are fixed to the upper surface of the blade support frame 57, so that rods 66a of the cylinders 66 are in contact with the upper surface of the blade mounting bar 58. Further, a pair of levelling blade lowering stepping motors 67 are fixed to the upper surface of the blade support frame 57 through brackets 68, while ball screws 69, which are driven by the stepping motors 67, are fitted with vertical moving member 70. The ball screws 69 are rotatably supported by bearings 71 which are mounted on the brackets 68. Guide rails 72 are fixed to the brackets 68, parallel with the ball screws 69, to slidably guide the vertical moving members 70. Pushers 73 are mounted on lower surfaces of first ends of the vertical moving members 70 to slidably pass through the blade support frame 57, and the lower ends of the pushers 73 are in contact with the upper surface of the blade mounting bar 59. Thus, the recovery blade 64 and the levelling blade 65 can be downwardly moved by the cylinders 66 and the stepping motors 67 respectively.

In order to collect electrode paste which is injected into the dipping vessel 50 toward a first end, the cylinders 66 are driven to press a blade member 64a, being provided in the lower end of the recovery blade 64, against the bottom surface of the dipping vessel 50, which in turn is slid by the motor 53. In order to adjust the collected electrode paste to a constant film thickness, the cylinder 66 are de-energized to upwardly move the recovery blade 64 by spring force of the spring 62, then the lower end of the levelling blade 65 is downwardly moved to a position close to the bottom surface of the dipping vessel 50 by the stepping motors 67, and the motor 53 is driven to slide the dipping vessel 50 in reverse.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for forming a layer of electrode paste on a bottom surface of a dipping vessel for applying electrodes onto ends of chip type electronic components, said apparatus comprising:

a frame;

a dipping vessel on the frame;

a recovery blade mounted on the frame for collecting said electrode paste on the bottom surface of said dipping vessel by moving the paste toward a first end of said dipping vessel;

a levelling blade mounted on the frame for levelling said electrode paste collected at said first end of said dipping vessel, by moving the paste toward a second end of said dipping vessel while forming the paste to have a constant thickness over the bottom surface of said dipping vessel;

driving means for relatively reciprocating said recovery blade and said levelling blade with respect to said dipping vessel for collecting and levelling the paste;

first moving means for moving said recovery blade between a position in contact with the bottom surface of said dipping vessel when collecting the paste and a retracted position when not collecting the paste; and second moving means for moving said levelling blade between a position spaced from the bottom surface of said dipping vessel by a distance corresponding to said constant thickness when levelling the paste, and a retracted position when not levelling the paste.

2. An apparatus according to claim 1, wherein
said dipping vessel is in a fixed position on the frame and is provided with sliding means on opposite side portions of the dipping vessel;
a blade support frame, being slidable along said sliding means and being reciprocated by said driving means, said blade support frame being arranged to extend across said dipping vessel; and
said recovery blade and said levelling blade being mounted on said blade support frame via said first moving means and said second moving means, respectively.

3. An electrode forming apparatus in accordance with claim 1, further comprising
sliding means on said frame;
said dipping vessel being slidable along said sliding means, and being reciprocated by said driving means; and
a blade support frame mounted in a fixed position on said frame via said first moving means and said second moving means, said recovery blade and said levelling blade being mounted on said blade support frame.

4. An apparatus for forming a layer of electrode paste on a bottom surface of a dipping vessel for applying electrodes onto ends of chip type electronic components, said apparatus comprising:
a blade assembly having a recovery blade for collecting the electrode paste on the bottom surface of a dipping vessel and a levelling blade for levelling the collected paste to a constant thickness over the bottom surface of such dipping vessel;
moving means for relatively moving the recovery blade with respect to be in contact with and along the bottom surface to collect the paste, and away from the bottom surface after collecting the paste; and for moving the levelling blade to a position separated from the bottom surface by a predetermined gap corresponding to said constant thickness, and of relatively moving the levelling blade with respect to and along the bottom surface, to form the layer of electrode paste, and away from the bottom surface after levelling the paste.

5. An apparatus according to claim 4, further comprising a frame and means for holding such dipping vessel in a fixed position with respect to the frame; wherein the moving means moves the blades with respect to the fixed position of such dipping vessel.

6. An apparatus according to claim 4, wherein said moving means comprises driving means for causing relative movement of the blade assembly and such dipping vessel so as to move the recovery blade and the levelling blade along the bottom surface of such dipping vessel.

7. An apparatus according to claim 6, wherein said blade assembly comprises a blade support frame for mounting the recovery blade and the levelling blade on the frame, the blades being mounted on the blade support frame with means for moving the blades toward and away from the bottom surface of such vessel, and the blade support frame being reciprocated by the driving means; and
guide means for being attached to such dipping vessel for guiding the blade support frame relative to such dipping vessel when the blade support frame is reciprocated by the driving means.

8. An apparatus according to claim 4, further comprising a frame and means for holding the blade assembly in a fixed position with respect to the frame; wherein the moving means moves such dipping vessel with respect to the fixed position of the blade assembly.

9. An apparatus according to claim 8, further comprising guide means for being attached to such dipping vessel for guiding such dipping vessel relative to the blade assembly when the moving means moves such dipping vessel; and
a blade support frame for mounting the recovery blade and the levelling blade on the frame, the blades being mounted on the blade support frame with means for moving the blades toward and away from the bottom surface of such vessel, the blade support frame being held in a constant position with respect to such dipping vessel.

10. An apparatus according to claim 4, further comprising a frame; and mounting means for demountably holding such dipping vessel and blade assembly on the frame, the dipping vessel and such blade assembly being interconnected so as to retain their relative position when demounted from the frame.

11. An apparatus for forming a layer of electrode paste on a bottom surface of a dipping vessel for applying electrodes onto ends of chip type electronic components, said apparatus comprising:
a recovery blade for collecting the electrode paste on the bottom surface of a dipping vessel and a levelling blade for levelling the collected paste to a constant thickness over the bottom surface of such dipping vessel;
first vertical moving means for vertically moving the recovery blade to contact the bottom surface to collect the paste, and away from the bottom surface after collection of the paste;
second vertical moving means for vertically moving the levelling blade to a position separated from the bottom surface by a predetermined gap corresponding to the constant thickness of the layer of electrode paste, and away from that position after levelling the paste; and
driving means for relatively horizontally reciprocating the recovery blade and the levelling blade with respect to such dipping vessel so that the recovery blade collects the electrode paste at a first end of such dipping vessel when the recovery blade is in contact with the bottom surface, and the levelling blade levels the electrode paste toward a second opposite end to form the layer of electrode paste.

12. An apparatus according to claim 11, further comprising such dipping vessel held in a constant horizontal position;
a blade support frame for mounting the recovery blade and the levelling blade, the blade support frame extending across such dipping vessel and being reciprocated by the driving means, the blades being mounted on the blade support frame with the first vertical moving means and the second vertical moving means, respectively; and
sliding means attached to opposite side portions of such dipping vessel so that the blade support frame is horizontally slidable, with respect to such dipping vessel, on being reciprocated by the driving means.

13. An apparatus according to claim 11, further comprising such dipping vessel being reciprocated by the driving means;

sliding means attached to such dipping vessel so that such dipping vessel is horizontally slidable, with respect to the blades, on being reciprocated by the driving means; and a blade support frame for mounting the recovery blade and the levelling blade, the blade support frame extending across such dipping vessel and being held in a constant horizontal position with respect to the dipping vessel, the blades being mounted on the blade support frame with the first vertical moving means and the second vertical moving means, respectively.

14. An apparatus according to claim 11, further comprising mounting means for demountably holding such dipping vessel, such dipping vessel and the blade assembly being interconnected so as to retain their relative position when demounted.

* * * * *